United States Patent [19]

McCune

[11] Patent Number: 5,306,971
[45] Date of Patent: Apr. 26, 1994

[54] BINARY CONTROLLED DIGITAL TAPPED DELAY LINE

[75] Inventor: Earl McCune, Santa Clara, Calif.
[73] Assignee: Proxim, Inc., Mountain View, Calif.
[21] Appl. No.: 917,386
[22] Filed: Jul. 23, 1992
[51] Int. Cl.[5] .............................................. H03K 5/13
[52] U.S. Cl. .................................... 307/603; 307/605; 307/608; 307/602
[58] Field of Search ................ 307/597, 602, 603, 606, 307/605, 608

[56] References Cited

U.S. PATENT DOCUMENTS

| | | | |
|---|---|---|---|
| 3,351,776 | 11/1967 | Chin | 307/603 |
| 4,641,048 | 2/1987 | Pollock | 307/597 |
| 4,746,880 | 5/1988 | McCune, Jr. | 332/16 |
| 5,111,085 | 5/1992 | Stewart | 307/603 |
| 5,122,792 | 6/1992 | Stewart | 340/793 |
| 5,148,055 | 9/1992 | Nohara | 307/603 |
| 5,175,454 | 12/1992 | Murakami | 307/603 |
| 5,191,234 | 3/1993 | Murakami et al. | 307/597 |

OTHER PUBLICATIONS

Otsuji, Tai α Ichi et al., A 10-ps Resolution, Process-Insensitive Timing Generator IC, *IEEE Journal of Solid-State Circuit*, vol. 24, No. 5, Oct. 1989, pp. 1412–1417.

*Primary Examiner*—Stuart S. Levy
*Assistant Examiner*—Shawn Riley
*Attorney, Agent, or Firm*—Burns, Doane, Swecker & Mathis

[57] ABSTRACT

An electronic, binary-controlled digital tapped delay line is realized by a plurality of like stages connected in cascade. Each stage comprises a differential amplifier circuit responsive to a pair of input signals for producing a pair of output signals and including a differential transistor pair. A first loading circuit formed by a plurality of load devices interconnected to produce a cumulative loading effect is connected to an input of a first transistor of the differential transistor pair for delaying turn-on of the first transistor. Similarly, a second loading circuit formed by a plurality of load devices interconnected to produce a cumulative loading is connected to an input of a second transistor of the differential transistor pair for delaying turn-on of the second transistor, the first and second loading circuits each being connected to a first circuit node. A delay control circuit is responsive to a binary control signal and connected to the first circuit node for causing turn-on of the first and second transistors to be delayed by a set amount of time when the binary control signal is asserted.

8 Claims, 7 Drawing Sheets

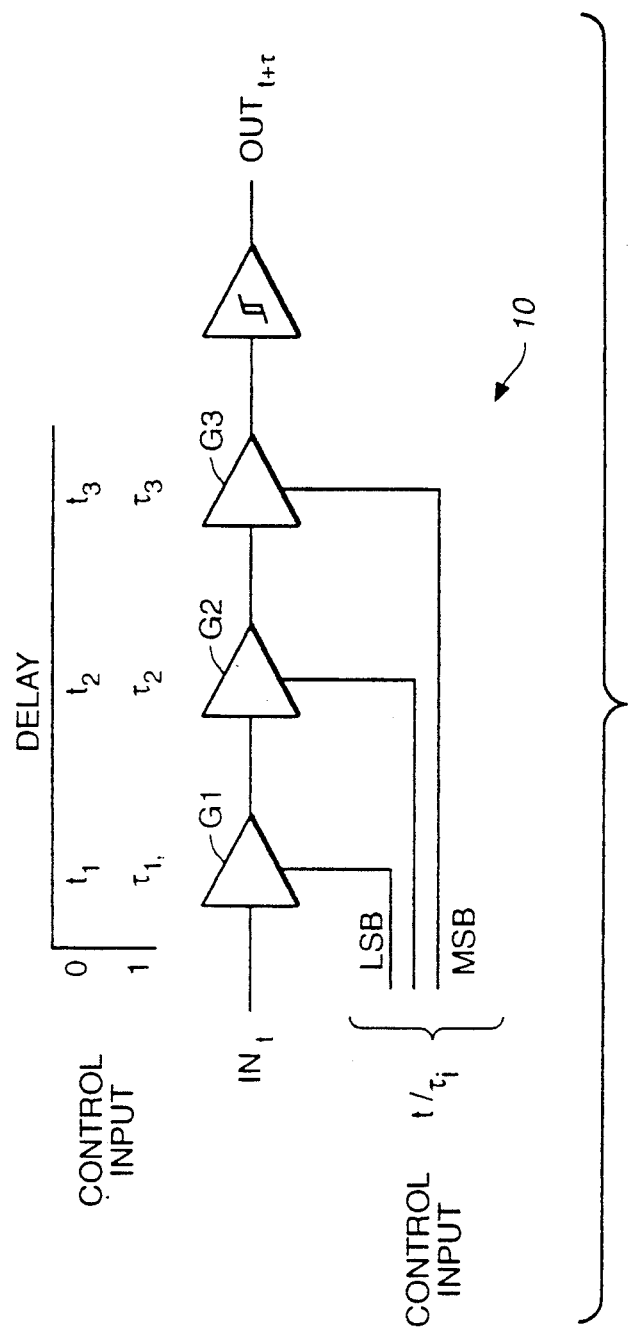
FIG._1

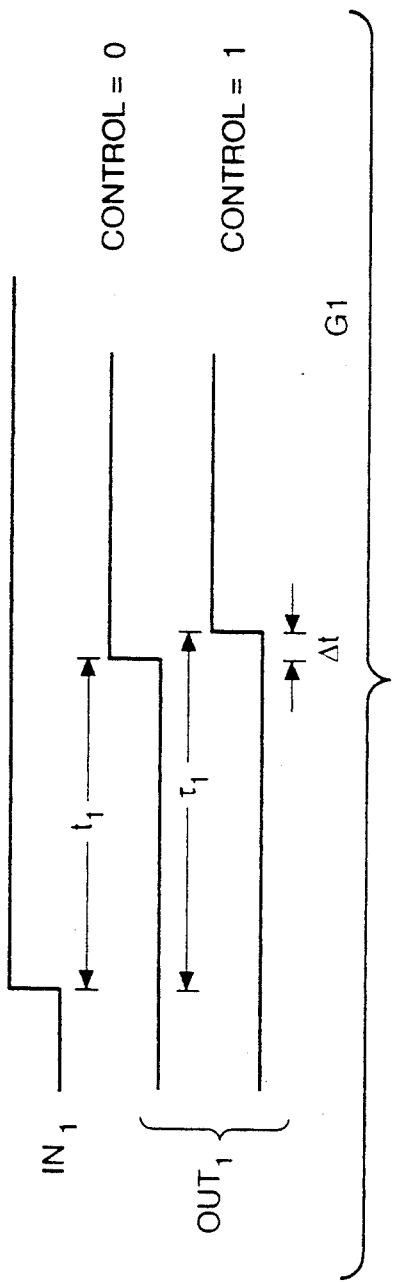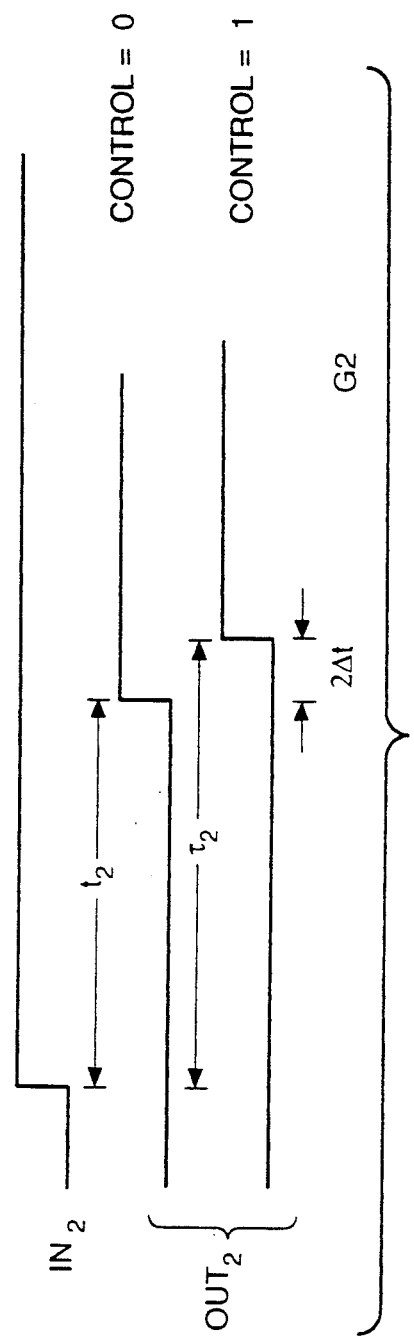

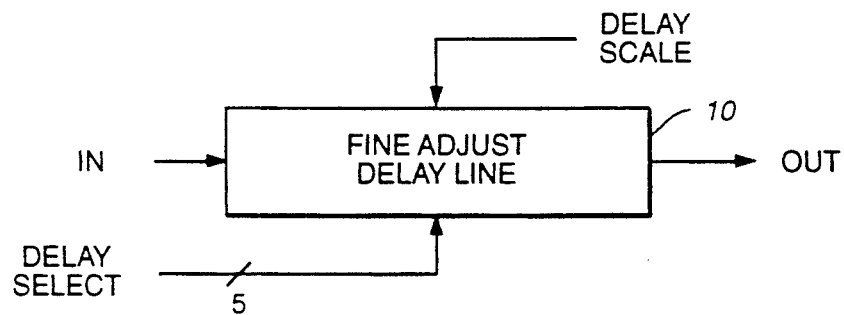
FIG._3A
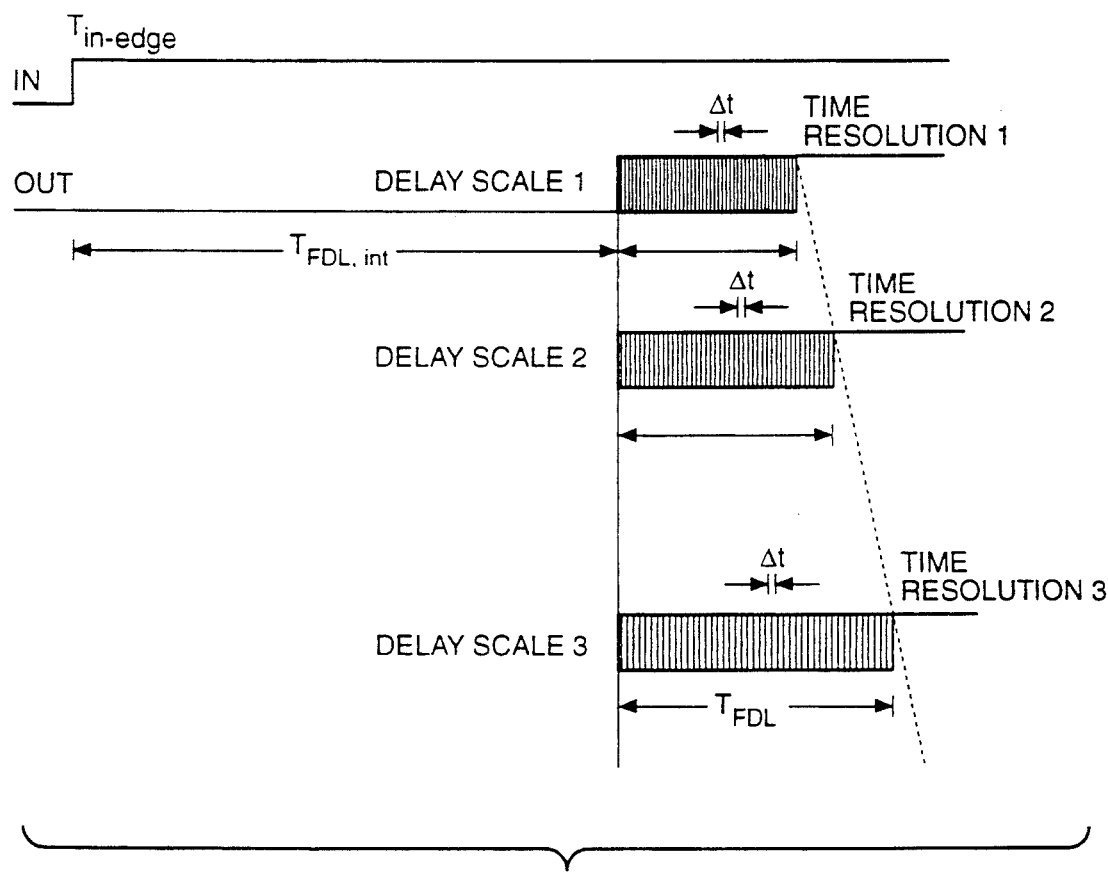
FIG._3B

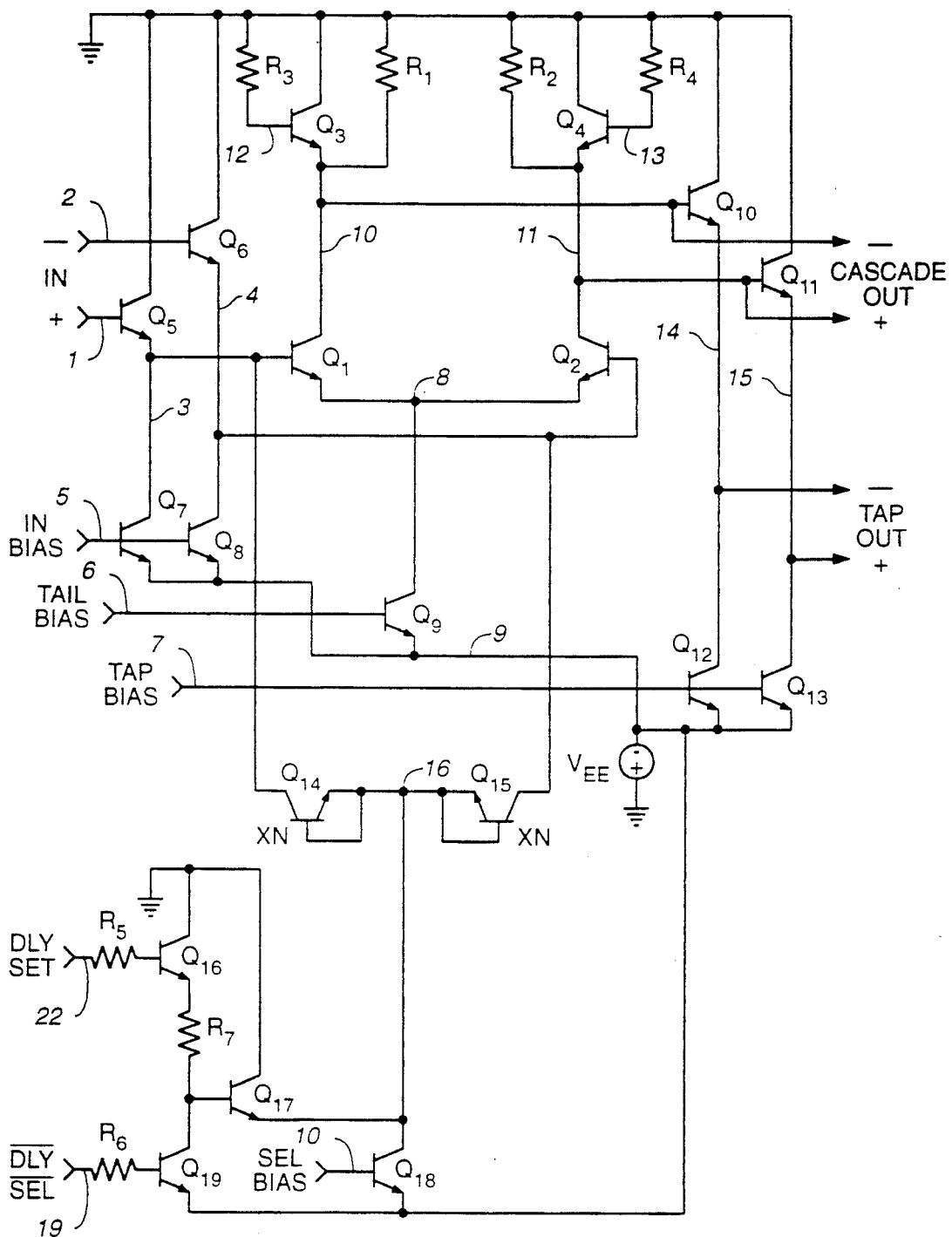
FIG._4

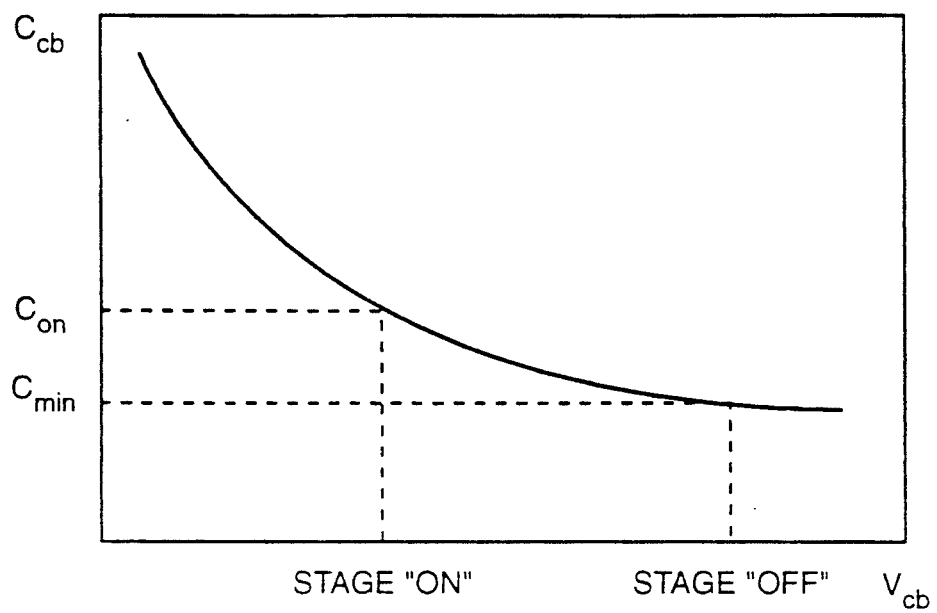
FIG._5A
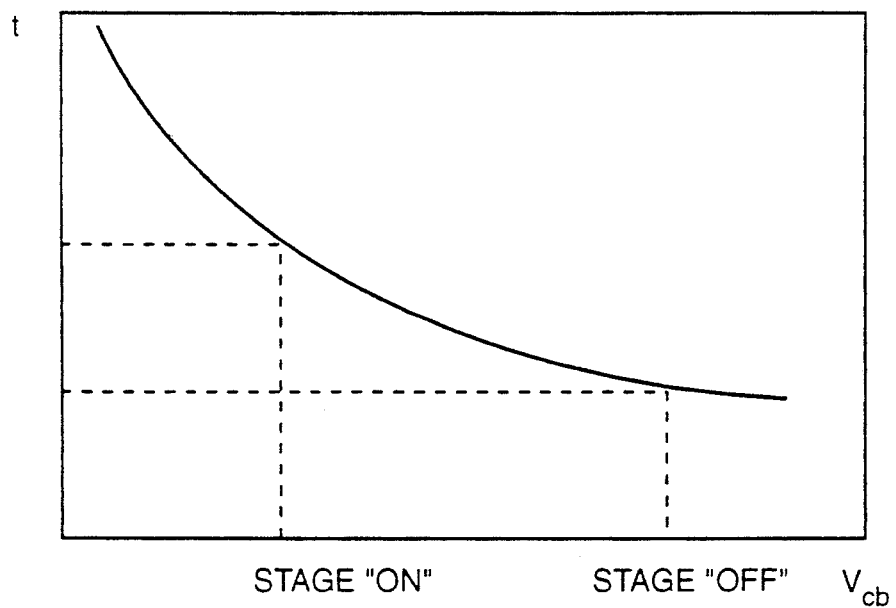
FIG._5B

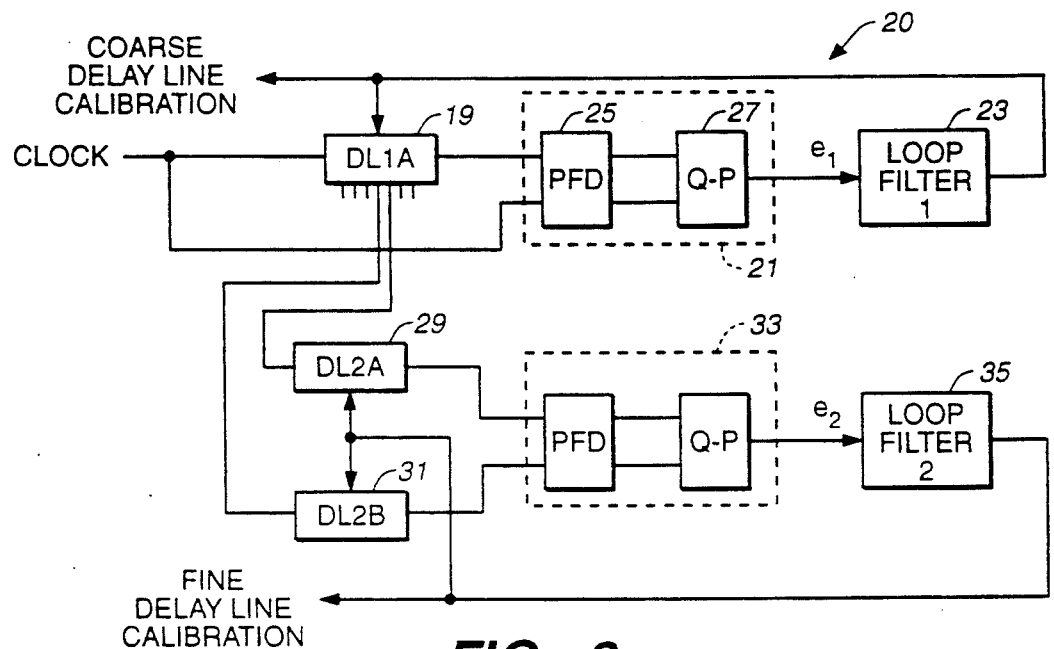
FIG._6
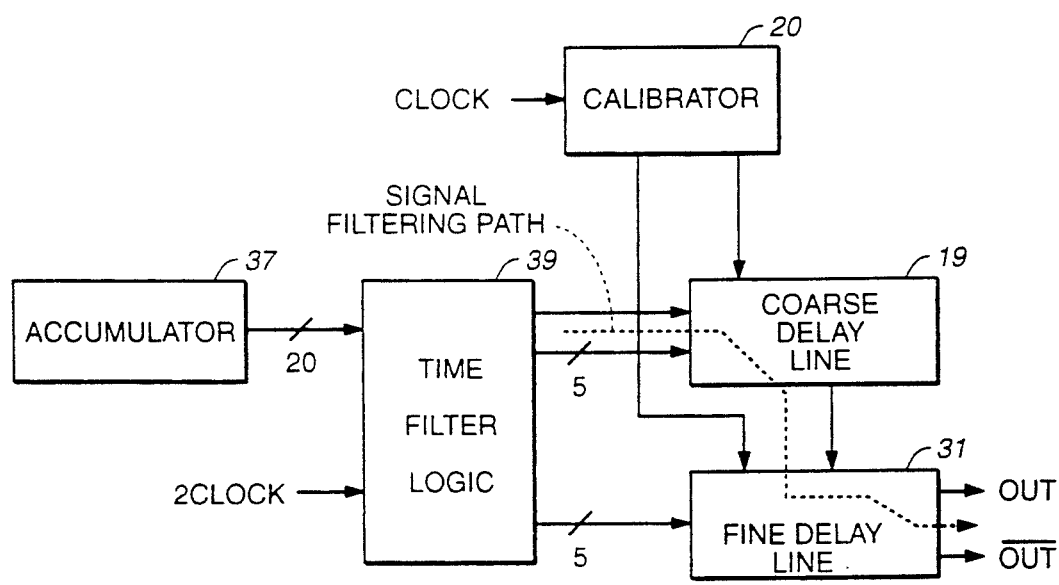
FIG._7

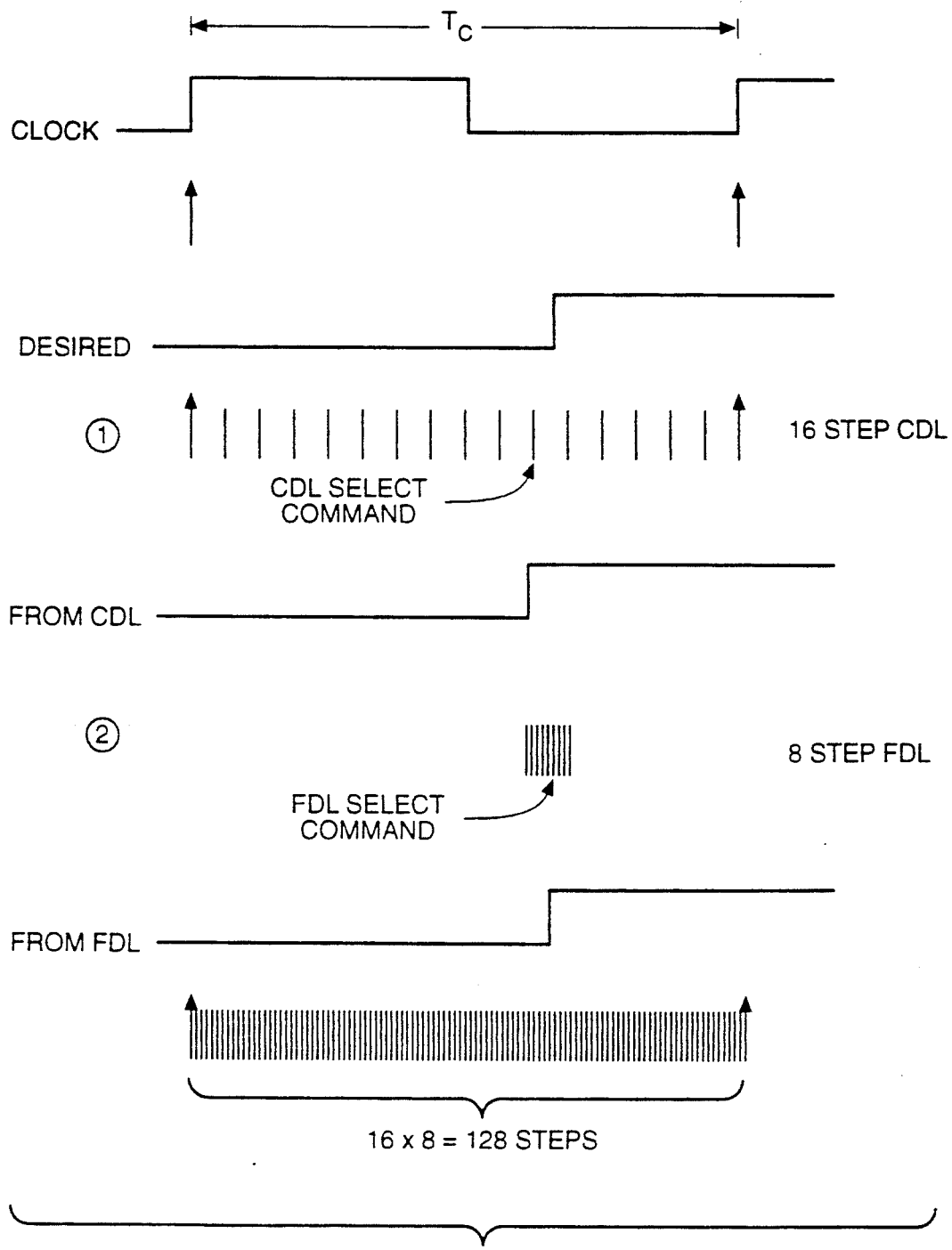
FIG._8

BINARY CONTROLLED DIGITAL TAPPED DELAY LINE

BACKGROUND OF THE INVENTION

1. Field of the Invention

The present invention relates to variable delay lines and more particularly to a variable-delay, digital tapped delay line.

2. State of the Art

In digital frequency synthesis, a square-wave clock signal of a given reference frequency may be used to generate digital signals of a wide range of frequencies by subdividing the clock period into a number of equal subdivisions, producing digital signals corresponding to each subdivision, and selecting for output the digital signal having a time of occurrence most nearly coincident with the time of occurrence of signal transitions in the desired output signal. Such a technique may be described generally as vernier interpolation, a particular instant of time between the beginning and end of a reference clock period being interpolated using a time scale (vernier) calibrated to indicate fractional parts of a clock period.

In effect, vernier interpolation provides time filtering information as a fraction of the applied clock period. Commands to the time filter therefore represent relative time, and not absolute time. This difference may be explained as follows. Assume that the interval between a time t1 and a time t2 represents a time interval to be spanned using smaller equal time intervals. In absolute time division, the smaller intervals are each of a fixed duration $\Delta t_f$. When a number of the smaller intervals are added together in an attempt to match the large interval, an interval match error will usually occur between the time t2 and the end of the last smaller time interval. In relative time division, the smaller time intervals are each of a variable duration $\Delta t_i$ set equal to $(1N)(t_2-t_1)$ such that N of the smaller intervals added together exactly equals the interval between $t_1$ and $t_2$.

According to the foregoing explanation, for vernier interpolation, a delay structure must be built that is calibrated and operates in relative time. Conventional delay lines that are implemented to achieve a particular time resolution are therefore not applicable to vernier interpolation.

Furthermore, to be used with vernier interpolation, a line must be designed to provide equal delay intervals between taps. As the overall delay of the line is varied, each tap interval must align to an exact fraction of the total delay. The output signal quality is dependent on the uniformity of the tap intervals and on the total number of taps.

To achieve the desired uniformity of tap intervals, the delay circuit should be fully integrable and sufficiently small to fit on a single integrated circuit chip. On any specific IC die, spatial gradients of transistor parameters are generally small. The closer the transistors are physically, the more likely they are to exhibit identical characteristics.

The foregoing criteria are satisfied by a delay line structure disclosed in U.S. application Ser. No. 07/917,322 filed Jul. 23, 1992 entitled "Variable Delay Digital Tapped Delay Line", incorporated herein by reference. Using the foregoing delay line structure, time resolution in the 50 to 90 picosecond range may be obtained. It would be desirable to be able to achieve a finer time resolution in the range of one picosecond or a few picoseconds. Such fine resolution may be achieved using the binary-controlled digital tapped delay line of the present invention in cooperation with the aforementioned delay line structure. In effect, the aforementioned delay line structure is used as a coarse delay line to achieve relatively coarse subdivision of a time interval to be spanned, and the delay line structure of the present invention is used as a fine delay line to subdivide much more finely a particular subdivision of interest of the coarse delay line.

SUMMARY OF THE INVENTION

According to the present invention, a binary-controlled digital tapped delay line is realized by a plurality of like stages connected in cascade. Each stage comprises a differential amplifier circuit responsive to a pair of input signals for producing a pair of output signals and including a differential transistor pair. A first loading circuit formed by a plurality of load devices interconnected to produce a cumulative loading effect is connected to an input of a first transistor of the differential transistor pair for delaying turn-on of the first transistor. Similarly, a second loading circuit formed by a plurality of load devices interconnected to produce a cumulative loading effect is connected to an input of a second transistor of the differential transistor pair for delaying turn-on of the second transistor, the first and second loading circuits each being connected to a first circuit node. A delay control circuit is responsive to a binary control signal and connected to the first circuit node for causing turn-on of the first and second transistors to be delayed by a set amount of time when the binary control signal is asserted.

BRIEF DESCRIPTION OF THE DRAWINGS

FIG. 1 is a simplified block diagram of the binary-controlled digital tapped delay line of the present invention;

FIGS. 2a and 2b are timing diagrams explaining the operation of FIG. 1;

FIG. 3a is a block diagram of the delay line of FIG. 1 showing an additional delay scale input;

FIG. 3b is a timing diagram showing the effect of the delay scale input;

FIG. 4 is a schematic diagram of one stage of the delay line of the present invention;

FIG. 5a is a graph illustrating the varactor effect exhibited by the transistors $Q_{14}$ and $Q_{15}$ in FIG. 4;

FIG. 5b is a graph illustrating time delay variation in accordance with the varactor effect of FIG. 5a.

FIG. 6 is a block diagram of a calibration portion of a vernier interpolation apparatus using the binary-controlled digital tapped delay line of the present invention;

FIG. 7 is a overall block diagram of a time filter architecture for vernier interpolation; and FIG. 8 is a timing diagram illustrating operation of the apparatus of FIG. 7.

DETAILED DESCRIPTION OF THE PREFERRED EMBODIMENTS

Referring now to FIG. 1, the binary-controlled digital tapped delay line 10 is made up of a number of similar stages or gates, G1, G2, and G3, connected in cascade. Each gate has two states, and "on" state and an "off" state and exhibits different propagation delays depending on its state. Accordingly, each gate, besides having an input and an output terminal, also has a control terminal. When a control signal applied to the control terminal of a particular gate is asserted, that gate exhibits a longer propagation delay $\tau$ than an intrinsic propagation delay t exhibited by the gate when its control input is deasserted. The difference between t and $\tau$ is binary-weighted from gate to gate. Assuming, for example, that the gates are arranged from least delay to greatest delay, when a least significant bit of a control input used to select between t and $\tau$ for each of the gates is asserted, the propagation delay exhibited by the gate G1 will increase by an amount $\Delta t = \tau_1 - t_1$. Since the gates are arranged from least delay to greatest delay, the delay $\Delta t$, is the resolution, or step size, of the delay line. The difference between $\tau$ and t for the next gate G2 is twice the step size, $2\Delta t$, and the difference between $\tau$ and t for the next succeeding gate G3 is four times the step size, $4\Delta t$. This relationship is illustrated in Table 1 below.

TABLE 1

| |
|---|
| $\tau_1 - t_1 = \Delta t$ |
| $\tau_2 - t_2 = 2\Delta t$ |
| $\tau_3 - t_3 = 4\Delta t$ |

By varying the control input word, an input $IN_t$ occurring at time t may be delayed by any of eight different delay amounts to produce an output $OUT_{t+T}$. When the control input word is zero, all of the gates are "OFF", and the input signal is delayed by an amount $t_1 + t_2 + t_3$. When the control input word is 001, the first gate G1 is "ON" such that the input signal is delayed by an amount $t_1 + t_2 + t_3 + \Delta t$. When the control input word is 010, the second gate G2 is "ON" such that the input signal is delayed by an amount $t_1 + t_2 + t_3 + 2\Delta t$, and so forth. This relationship is shown in Table 2 below. For simplicity, Table 2 assumes that $t_1 = t_2 = t_3$. In actuality however, the intrinsic delays of the gates are also substantially binary-weighted. The notation of Table 2 has been adopted for convenience only.

TABLE 2

| Control | Total delay T |
|---|---|
| 0 | $3t + 0\Delta t = 3t$ |
| 1 | $3t + \Delta t = \tau_1 + 2t$ |
| 2 | $3t + 2\Delta t = \tau_2 + 2t$ |
| 3 | $3t + 3\Delta t = \tau_1 + \tau_2 + t$ |
| 4 | $3t + 4\Delta t = \tau_3 + 2t$ |
| 5 | $3t + 5\Delta t = \tau_1 + \tau_3 + t_2$ |
| 6 | $3t + 6\Delta t = \tau_2 + \tau_3 + t$ |
| 7 | $3t + 7\Delta t = \tau_1 + \tau_2 + \tau_3$ |

As may be observed from Table 2, the total delay T experienced by the input signal is equal to the sum of a constant term 3t (representing $t_1 + t_2 + t_3$) and a variable number of delay steps $\Delta t$.

The relationship of Table 2 is further illustrated in FIG. 2a for gate G1 and in FIG. 2b for gate G2. Referring to FIG. 2a, in the case of gate G1, when the control input to gate G1 is 0, the input to the gate, $In_1$, is delayed by an amount $t_1$ to produce an output $OUT_1$. When the control input is 1, the input is delayed by an amount $\tau_1$ equal to $t_1$ plus an additional increment $\Delta t$. In the case of gate G2 as illustrated in FIG. 2b, when the control input is 0 the input of the gate is delayed by an amount $t_2$, and when the control input is 1, the input to the gate is delayed by an additional increment $2\Delta t$.

For vernier interpolation, the delay line structure of U.S. application Ser. No. 07/917,322 is used as a coarse delay line to achieve relatively coarse subdivision of a time interval to be spanned, and the delay line structure described herein is used as a fine delay line to subdivide much more finely a particular subdivision of interest of the coarse delay line. Provision must therefore be made to adjust the step size $\Delta t$ of the fine delay line in order to calibrate the delay line such that an integral number of steps exactly spans a subdivision of the coarse delay line. A delay scale input is provided for this purpose as illustrated in FIG. 3a.

The delay scale input is input in common to each of the stages of the delay line. In FIG. 3a, the delay line is assumed to be five stages long, such that the delay select input is five bits wide. A total of $2^5 = 32$ delay intervals may therefore be realized. The effect of the delay scale input is illustrated in FIG. 3b wherein an input transition occurring at a time $T_{in\text{-}edge}$ is delayed by the intrinsic delay of the fine delay line, $T_{FDL,int}$, plus some number of delay steps of a size depending on the delay scale input. When the delay scale input is at a first level, the delay step $\Delta t$ is very small, resulting in a very fine time resolution. The maximum additional delay $T_{FDL}$ beyond the intrinsic delay of the fine delay line is shorter than when the delay scale input is at a higher level. When the delay scale input is at a higher level, the delay step $\Delta t$ is longer and the maximum full scale incremental delay $T_{FDL}$ is longer. A continuum of time resolutions may therefore be achieved at different levels of the delay scale input.

An important characteristic of the stages of the binary-controlled digital taped delay line of the present invention is that they exhibit an equal delay for both rising edges and falling edges. Digital circuits typically have different propagation delays for rising edges and falling edges. This asymmetry, usually not a problem for arithmetic calculations and so forth, is a serious problem for purposes of vernier interpolation. If a square wave output having a duty cycle of exactly 50% may be generated, then even harmonics may be completely suppressed such that spurious signal components are reduced. A 50% duty cycle may be achieved only if the stages have the same propagation delay for both rising edges and falling edges.

In order to achieve the same propagation delay for both rising and falling edges, the present tapped delay line uses completely symmetric circuits for the digital delay stages. In particular, the delay line uses the most symmetric circuit, the differential amplifier. The inputs and outputs of the stages of FIG. 1, although indicated by single lines, are therefore complimentary signal pairs, one of the signals being true and the other of the signals being inverted.

Referring now to FIG. 4, a circuit realization of the digital delay stages of FIG. 1 invention will be described in detail. Transistors $Q_1$ and $Q_2$ form a differential transistor pair, receiving differential inputs at nodes 3 and 4 and producing a differential output at nodes 10 and 11. Connected to the collector of the transistor $Q_1$ at node 10 is a pull-up circuit including transistor $Q_3$ and resistors $R_1$ and $R_3$. The transistor $Q_3$ and the resistor $R_1$ are connected in parallel between node 10 and circuit ground at node 0. The resistor $R_3$ is connected from ground to the base of the transistor $Q_3$ at node 12. A similar pull-up circuit including transistor $Q_4$ and resistors $R_2$ and $R_4$ is connected to the collector of the transistor $Q_2$ at node 11.

Transistors $Q_5$ and $Q_6$ receive a differential input signal to the stage at nodes 1 and 2, producing a differential input signal to the differential transistor pair at nodes 3 and 4. The transistors $Q_5$ and $Q_6$ present a high impedance to the previous stage and prevent delay variations from affecting the previous stage. The differential output produced by the differential transistor pair $Q_1$ and $Q_2$ at nodes 10 and 11 is buffered by transistors $Q_{10}$ and $Q_{11}$ to produce a differential tap output TAP OUT. The differential output of the differential transistor pair is used directly as a cascade output CASCADE OUT for input to a succeeding stage.

Each of the transistors $Q_5$, $Q_6$, $Q_{10}$ and $Q_{11}$ are connected through respective biasing transistors $Q_7$, $Q_8$, $Q_{12}$ and $Q_{13}$ to a source of negative potential $V_{EE}$. A fixed input bias setting signal INBIAS is applied to the gates of the transistors $Q_7$ and $Q_8$, and a fixed tap bias setting signal TAP BIAS is applied to the gates of the transistors $Q_{12}$ and $Q_{13}$. A further biasing transistor $Q_9$ is connected to the tail of the differential transistor pair at node 8 and is controlled by a fixed signal TAIL BIAS applied at node 6.

In order to controllably vary the turn-on delay of the differential transistor pair $Q_1$ and $Q_2$, a predetermined number of transistors connected in parallel and each having its emitter-base junction short-circuited are connected to the bases of the transistors $Q_1$ and $Q_2$. The transistor $Q_{14}$ with its accompanying notation "XN" therefore represents some number of transistors each connected identically as the transistor $Q_{14}$ with its collector connected to the base of the transistor $Q_1$ at node 3 and its base and emitter connected to node 16. The transistor $Q_{15}$ also represents some number of transistors connected identically as the transistor $Q_{15}$ to the base of the transistor $Q_2$ and to the circuit node 16. By short-circuiting the emitter-base junction of the transistors represented by the transistors $Q_{14}$ and $Q_{15}$ the transistors effectively become varactor diodes, or voltage controlled capacitors, the capacitance of which is controlled by the voltage at node 16. By appropriately choosing the number of transistors $Q_{14}$ and $Q_{15}$ in each stage, the delay characteristics of the stage may be controlled in order to achieve the binary weighting previously described.

The varactor effect of the transistors $Q_{14}$ and $Q_{15}$ may be better appreciated with reference to FIG. 5a in which the collector-base capacitance $C_{cb}$ of a single transistor is plotted against the collector-base voltage $V_{cb}$. The junction capacitance decreases exponentially with the junction voltage. The junction voltage may be controlled by the voltage applied to node 16. When the control input to a particular stage is deasserted, a higher voltage is applied to node 16 and the stage is turned "OFF" such that the transistors $Q_{15}$ and $Q_{16}$ exhibit a minimum capacitance $C_{min}$. When the control input to the stage is asserted, a lower voltage is applied to node 16 such that the stage turns "ON" and the transistors $Q_{15}$ and $Q_{16}$ exhibit a greater capacitance $C_{on}$.

The time delay of the stage is proportional to the capacitive loads applied to the bases of transistors $Q_1$ and $Q_2$ by transistors $Q_{15}$ and $Q_{16}$. The time delay of the stage as a function of the junction voltage $V_{cb}$ of transistors $Q_{15}$ and $Q_{16}$ therefore exhibits a similar characteristic as the junction capacitance as may be seen in FIG. 5b.

To allow for calibration of the fine delay line for purposes of vernier interpolation, the stage "ON" voltage operating point may be shifted by the delay scale input signal shown in FIG. 3a. Referring again to FIG. 4, a delay set signal DLY SET applied at node 22 is amplified by a pair of Darlington-connected transistors $Q_{16}$ and $Q_{17}$ and then applied to node 16 as the delay scale input. The control input to the stage is applied to node 19 and is represented as DLY SEL. As with the other amplifiers in the circuit, the amplifier formed by transistors $Q_{16}$ and $Q_{17}$ is connected through a bias transistor $Q_{18}$ to $V_{EE}$. The bias transistor $Q_{18}$ is controlled by a fixed signal SEL BIAS applied to the base of the transistor at node 10. When the control input DLY SEY is deasserted, current flows through resistor $R_6$ so as to turn transistor $Q_{19}$ on and transistor $Q_{17}$ off. The transistor $Q_{17}$ therefore ceases to operate as a source of bias current for transistor $Q_{18}$, which saturates, connecting node 16 to $V_{EE}$ and turning the stage "OFF". When the control input is asserted low, the transistor $Q_{19}$ is prevented from turning the transistor $Q_{17}$ off, such that the delay set signal is applied to node 16, causing the stage to turn "ON".

Although in FIG. 1 the delay line of the present invention was described in terms of the stages being arranged in order of increasing delay, testing of the circuit of FIG. 4 has indicated that the opposite arrangement is in fact preferable; i.e., the stages should be arranged in order of decreasing delay. This arrangement is preferable because, as the stage delay increases, the stage begins to behave more and more like a low pass filter. The stages with greatest delay are therefore placed at the front of the delay line so that the contribution of the smaller-delay stages will not be obliterated.

The fine delay line presently described will find numerous applications in digital electronics, particularly in the field of digital signal processing. An exemplary application of the fine delay line to vernier interpolation will be described with reference to FIGS. 6, 7 and 8. As previously described, vernier interpolation attempts to span a particular time interval by dividing that time interval into equal time subdivisions. To obtain very fine time resolution, a two-step approach may be employed in which a coarse delay line is used to achieve relatively coarse subdivision of a time interval to be spanned, and a fine delay line is used to subdivide much more finely a particular subdivision of interest of the coarse delay line. To eliminate interval match errors, calibration of both the coarse delay line and the fine delay line must be performed.

A suitable calibration arrangement is shown in FIG. 6. In the upper portion of FIG. 6, a coarse delay line 19 designated as DLLA is incorporated into a calibration loop including a time difference detector 21 and a loop filter 23. The time difference detector 21 is composed of a phase/frequency detector (PFD) 25 and a charge pump (Q-P) 27 in a manner well known in the art. A clock signal is applied to the coarse delay line DL1A and to the time difference detector 21 directly. The time difference detector 21 produces an error signal $e_1$ that is fed to the loop filter 23 to produce a coarse delay line calibration signal used to lengthen or shorten the time sub-intervals of the coarse delay line until the number of sub-intervals represented by the number of stages in the coarse delay line when added together exactly match a single clock period.

In the bottom portion of FIG. 6, two identical fine delay lines 29 and 31 are incorporated into a similar calibration loop including a time difference detector 33 and a loop filter 35. The control input word to a first fine delay line 29 (DL2A) is set to all zeros and the control input word to a second fine delay line 31 (DL2B) is set to all ones. Using the notation of FIG. 3b, the first fine delay line 29 (DL2A) exhibits only an intrinsic delay $T_{FDL,int}$ and the second fine delay line 31 (DL2B) exhibits the intrinsic delay plus an added full-scale delay increment $T_{FDL}$. The outputs of two adjacent taps of the coarse delay line are input to the fine delay lines, the preceding tap signal being input to the second fine delay line 31 set for full-scale delay and a succeeding tap signal being input to the first fine delay line 29 set to the intrinsic delay only. The calibration loop produces a fine delay line calibration signal input to both the fine delay lines so as to cause the time interval $T_{FDL}$ to exactly span the time interval between the signals of the two adjacent taps of the coarse delay line. As a result, a period of the clock signal is spanned by the coarse delay line and a time sub-interval of the coarse delay is in turn spanned by the fine delay line.

The coarse and fine delay lines and the calibrator of FIG. 6 may be incorporated into a time filter architecture for vernier interpolation as shown in FIG. 7. The first fine delay line 29 in FIG. 6 is used only for purposes of calibration to eliminate the effect of the intrinsic delay of the fine delay lines 29 and 31 and is therefore not shown in FIG. 7. The coarse delay line is assumed to be 32 stages long so as to realize 32 time subdivisions, and the fine delay line is assumed to be five stages long, also realizing 32 finer time subdivisions as a result of binary weighting. An accumulator 37 determines a desired time of occurrence of a signal transition and outputs the time of occurrence, represented by a 20-bit digital word, to a time filter logic circuit 39. The time filter logic circuit 39 operates at a frequency twice the reference clock frequency to select a tap of the coarse delay line 19 that will produce a delayed signal most nearly preceding the desired time of occurrence and to select a tap of the fine delay line 31 that will produce a signal further delayed so as to most closely coincide with the desired time. The signal to be timed-aligned therefore traverses a signal filtering path from the time filter logic 39 to the coarse delay line 19 and to the fine delay line 31 to produce a final output signal nearest in time to the desired time.

Operation of the time filter architecture of FIG. 7 is illustrated in FIG. 8. In FIG. 8, a clock signal having a period $T_c$ defined by two successive rising edges thereof is to be timed-aligned with a desired time. For simplicity, it will be assumed that the coarse delay line is 16 stages long and the fine delay line is 8 stages long. In a first step, a coarse delay line select command is produced by the time filter logic to select a tap signal of the coarse delay line most nearly preceding the desired time. In a second step, the time filter logic issues a fine delay line select command to select a tap signal of the fine delay line most nearly coinciding with the desired time. Using a 16-step coarse delay line and an 8-step fine delay line, a total resolution of 128 steps may be achieved. Any desired resolution may be achieved by adding additional stages to the coarse delay line and the fine delay line. In the example of FIG. 7, the coarse delay line is 32 stages long and the fine delay line is five stages long but realizes 32 steps because of binary weighting. Using 37 stages, a time resolution of over 1000 steps may be achieved.

It will be appreciated by those of ordinary skill in the art that the present invention may be embodied in other specific force without the party from the spirit and essential character thereof. The presently disclosed embodiments are therefore considered in all respects to be illustrative and not restricted. The scope of the invention is indicated by the appended claims rather than the foregoing description and all changes which come within the meaning and range of equivalence thereof are intended to be embraced therein.

What is claimed is:

1. A binary-controlled digital tapped delay line having a plurality of stages connected in cascade, each stage comprising:
    differential amplifier means responsive to a pair of input signals for producing a pair of output signals and including a differential transistor pair;
    first loading means comprising a plurality of load devices interconnected to produce a cumulative loading effect and connected to a input of a first transistor of said differential transistor pair for delaying turn-on of said first transistor;
    second loading means comprising a same plurality of load devices also interconnected to produce a cumulative loading effect and connected to an input of a second transistor of said differential transistor pair for delaying turn-on of second transistor, said first loading means and said second loading means each being connected to a first circuit node; and
    delay control means responsive to a binary-controlled signal and connected to said first circuit node for causing turn-on of first and second transistors to be delayed a set amount of time when said binary control signal is asserted.

2. The apparatus of claim 1 wherein said load devices are transistors each having a same junction short-circuited.

3. The apparatus of claim 2 wherein said transistors are bipolar transistors and said junction is a base-emitter junction.

4. The apparatus of claim 3 further comprising:
    input amplifier means connected to said differential amplifier means for receiving said input signals and for providing stage isolation; and
    output amplifier means connected to said differential amplifier means for receiving said output signals and producing a pair of level-shifted output signals.

5. The apparatus of claim 4 wherein said delay control means comprises delay set amplifier means responsive to a delay set signal for varying said set amount of time.

6. The apparatus of claim 5 further comprising bias setting means connected to said differential amplifier means, said input amplifier means, said output amplifier means and said delay set amplifier means for controlling respective bias points of said amplifier means.

7. The apparatus of claim 1 wherein each succeeding stage of said binary-controlled digital tapped delay line includes in said first and second loading means load devices of a number chosen so as to exhibit a cumulative loading effect approximately twice as great as that of said first and second loading means of the preceding stage.

8. The apparatus of claim 7 wherein a first stage of said binary-controlled digital tapped delay line includes in said first and second loading means load devices of a number chosen so as to exhibit a cumulative loading effect resulting in turn-on of said first and second transistors being delayed an amount of time equal to a desired time resolution.

* * * * *